(12) United States Patent
Lin

(10) Patent No.: US 9,222,961 B1
(45) Date of Patent: Dec. 29, 2015

(54) VERTICAL PROBE CARD AND METHOD FOR MANUFACTURING THE SAME

(71) Applicant: CHUNG HUA UNIVERSITY, Hsinchu (TW)

(72) Inventor: Jium Ming Lin, Hsinchu (TW)

(73) Assignee: CHUNG HUA UNIVERSITY, Hsinchu (TW)

( * ) Notice: Subject to any disclaimer, the term of this patent is extended or adjusted under 35 U.S.C. 154(b) by 35 days.

(21) Appl. No.: 14/445,415

(22) Filed: Jul. 29, 2014

(51) Int. Cl.
| | |
|---|---|
| *G01R 1/04* | (2006.01) |
| *G01R 1/30* | (2006.01) |
| *G01R 3/00* | (2006.01) |
| *G01R 31/26* | (2014.01) |
| *G01R 1/073* | (2006.01) |

(52) U.S. Cl.
CPC .............. *G01R 1/07314* (2013.01); *G01R 1/30* (2013.01); *G01R 3/00* (2013.01)

(58) Field of Classification Search
None
See application file for complete search history.

(56) References Cited

U.S. PATENT DOCUMENTS

| | | | |
|---|---|---|---|
| 6,861,858 B2 | 3/2005 | Chen et al. | |
| 7,750,651 B2 | 7/2010 | Chao et al. | |
| 2007/0210429 A1* | 9/2007 | Lin .......................... | H01L 24/12 257/678 |
| 2007/0229104 A1* | 10/2007 | Weiss ..................... | G01R 27/14 324/754.05 |
| 2012/0267782 A1* | 10/2012 | Chen .................... | H01L 23/3128 257/738 |
| 2014/0084955 A1 | 3/2014 | Teng et al. | |

FOREIGN PATENT DOCUMENTS

| | | |
|---|---|---|
| TW | 423123 | 2/2001 |
| TW | 584727 | 4/2004 |
| TW | 201003075 | 1/2010 |
| TW | 201244554 | 11/2012 |

OTHER PUBLICATIONS

Office Action dated Oct. 2, 2015 from the Taiwan Intellectual Property Office for counterpart application 103125787.
English abstract translation of the Office Action dated Oct. 2, 2015 from the Taiwan Intellectual Property Office for counterpart application 103125787.
English abstract translation of TW 423123.
English abstract translation of TW 201244554.
English abstract translation of TW 584727.
English abstract translation of TW 201003075.

* cited by examiner

*Primary Examiner* — Joseph Schoenholtz
(74) *Attorney, Agent, or Firm* — WPAT, P.C.; Anthony King

(57) ABSTRACT

A vertical probe card includes a bottom substrate, a top substrate, an interposer, a first set of electrically conductive polymer contacts, a second set of electrically conductive polymer contacts, a first anisotropic conductive film, and a second anisotropic conductive film. The interposer is disposed between the bottom substrate and the top substrate. The first set of electrically conductive polymer contacts is disposed on the surface of the bottom substrate opposite to the interposer. The second set of electrically conductive polymer contacts is disposed on the surface of the top substrate opposite to the interposer. The first set of electrically conductive polymer contacts are arranged differently from the second set of electrically conductive polymer contacts. The first anisotropic conductive film is disposed between the bottom substrate and the interposer, and configured to electrically connect the bottom substrate and the interposer. The second anisotropic conductive film is disposed between the interposer and the top substrate, and configured to electrically connect the interposer and the top substrate.

11 Claims, 7 Drawing Sheets

VERTICAL PROBE CARD AND METHOD FOR MANUFACTURING THE SAME

BACKGROUND

1. Technical Field

The present invention relates to a vertical probe card and a method for manufacturing the same.

2. Related Art

After integrated circuits on a wafer are completed, testing is conducted in order to identify bad dies before a packaging process is carried out so that bad dies will not be packaged and unnecessary cost will not increase.

Normally, a wafer under testing is placed in an environment of 80 to 150 degrees Celsius. In such a high temperature, the transverse thermal expansion of, for example, a 12-inch wafer, which has a coefficient of thermal expansion (CTE) of 2.8 ppm/K, is 23 to 44 micrometers. A probe card made of FR-4 material with a CTE of 18 ppm/K will transversely expand in a range of from 150 to 283 micrometers. Those thermal expansions will exert adverse influence to the alignment accuracy between the probes of the probe card and aluminum pads on the wafer under testing.

In addition, probes of a present probe card are formed with hard material, which may easily damage pads on a wafer under testing or metal layers beneath bumps.

SUMMARY

A vertical probe card of one embodiment of the present invention comprises a bottom substrate, a top substrate, an interposer disposed between the bottom substrate and the top substrate, a plurality of first electrically conductive polymer contacts disposed on the bottom substrate and opposite to the interposer, a plurality of second electrically conductive polymer contacts disposed on the top substrate and opposite to the interposer, a first anisotropic conductive film (ACF) disposed between the bottom substrate and the interposer, and a second anisotropic conductive film disposed between the interposer and the top substrate. The first electrically conductive polymer contacts are arranged differently from the second electrically conductive polymer contacts. The interposer is configured to electrically connect each first electrically conductive polymer contact and a corresponding one of the second electrically conductive polymer contacts. The first anisotropic conductive film is configured to electrically connect the bottom substrate and the interposer. The second anisotropic conductive film is configured to electrically connect the interposer and the top substrate.

In one embodiment of the present invention, a method for manufacturing a vertical probe card comprises disposing a first anisotropic conductive film on a bottom substrate; disposing an interposer on the first anisotropic conductive film; heating and compressing an assembly of the bottom substrate, the first anisotropic conductive film, and the interposer; disposing a second anisotropic conductive film on the interposer; disposing a top substrate on the second anisotropic conductive film; heating and compressing the assembly, the second anisotropic conductive film, and the top substrate; and spraying or coating electrically conductive material on a lower surface of the bottom substrate and an upper surface of the top substrate.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

Figure 1:
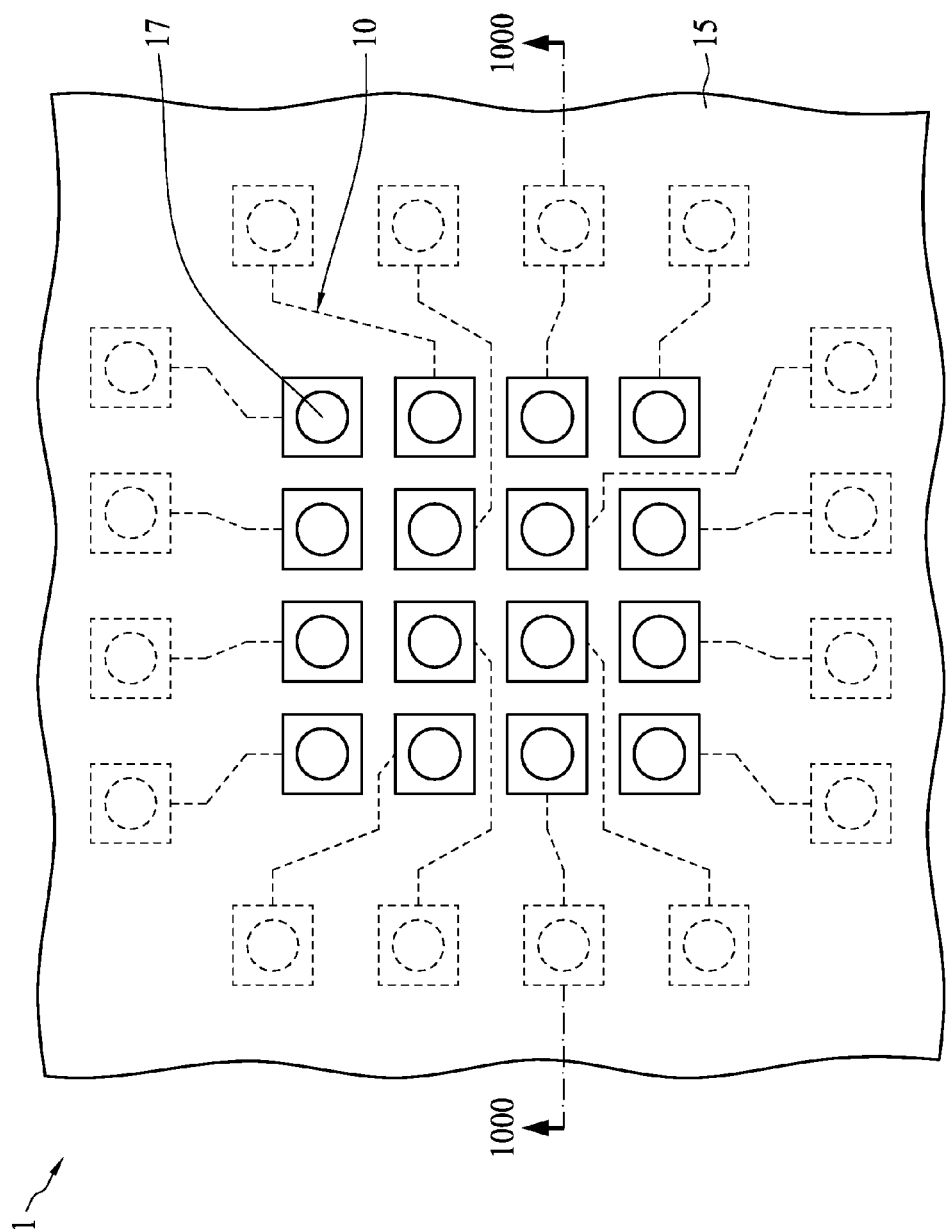
FIG. 1 is a schematic view showing a vertical probe card according to one embodiment.
Figure 2:
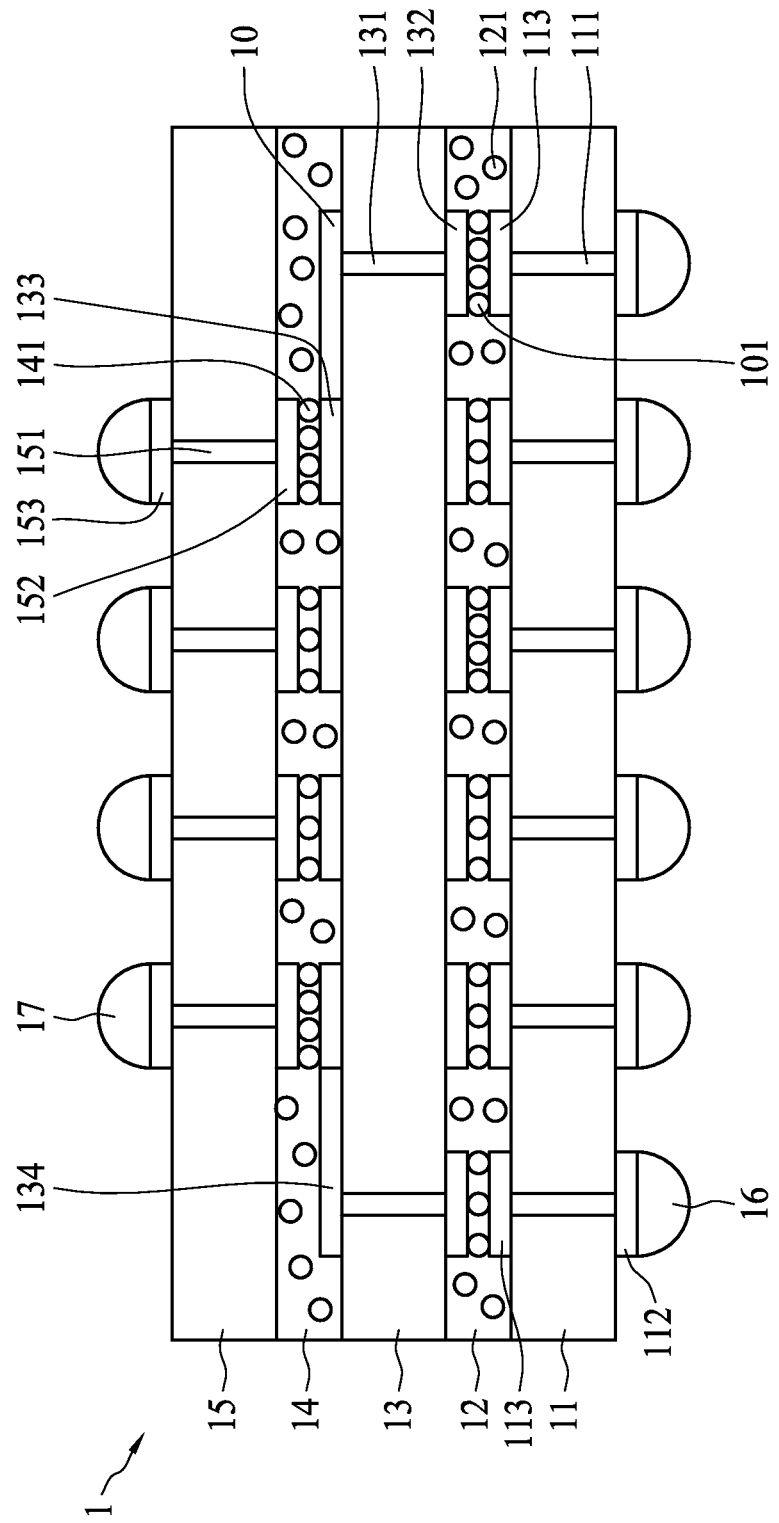
FIG. 2 is a cross-sectional view along line 1000-1000 of FIG. 1.

Referring to FIGS. 1 and 2, a vertical probe card 1 of at least one embodiment comprises a bottom substrate 11, a first anisotropic conductive film 12, an interposer 13, a second anisotropic conductive film 14, a top substrate 15, a plurality of first electrically conductive polymer contacts 16, and a plurality of second electrically conductive polymer contacts 17. The bottom substrate 11, the first anisotropic conductive film 12, the interposer 13, the second anisotropic conductive film 14, and the top substrate 15 are stacked in a vertical direction. The first electrically conductive polymer contacts 16 and the second electrically conductive polymer contacts 17 are respectively disposed on an upper and a lower surface of the vertical probe card 1 so that the vertical probe card 1 can electrically connect a testing apparatus and a chip, wafer, or display panel under testing; however, the present invention is not limited to such an application. Circuits on the bottom substrate 11, the interposer 13, and the top substrate 15 can work in coordination with the first anisotropic conductive film 12 and the second anisotropic conductive film 14 to form internal conductive paths 10, whereby each first electrically conductive polymer contact 16 can electrically connect to at least one second electrically conductive polymer contact 17. The arrangement of the first electrically conductive polymer contacts 16 is different from that of the second electrically conductive polymer contacts 17. In order to cope with such different arrangements of the two, the internal conductive paths 10 that connect at least a portion of the first electrically conductive polymer contacts 16 and their corresponding second electrically conductive polymer contacts 17 are configured to extend horizontally in or on the interposer 13.

Referring to FIGS. 1 and 2, the interposer 13 is disposed between the bottom substrate 11 and the top substrate 15. The first electrically conductive polymer contacts 16 are disposed opposite to the interposer 13 and on a lower surface of the bottom substrate 11. The second electrically conductive polymer contacts 17 are disposed opposite to the interposer 13 and on an upper surface of the top substrate 15. The interposer 13 is configured to have at least a portion of internal conductive paths 10 (or 134) extending horizontally so that each first electrically conductive polymer contact 16 can electrically connect to its corresponding second electrically conductive polymer contact 17. The first anisotropic conductive film 12 is disposed between the bottom substrate 11 and the interposer 13, and configured to form electrical connections between upper pads on the interposer 13 and corresponding lower pads on the bottom substrate 11. The second anisotropic conductive film 14 is disposed between the interposer 13 and the top substrate 15, and configured to form electrical connections between upper pads on the top substrate 15 and corresponding lower pads on the interposer 13.

Referring to FIGS. 1 and 2, the bottom substrate 11 comprises a plurality of vertical electrical connections 111, which are formed through the bottom substrate 11. A plurality of pads 112 and 113 are formed respectively on opposite lower and upper surfaces, and correspondingly connect to the vertical electrical connections 111. The first electrically conductive polymer contacts 16 correspond to the vertical electrical connections 111. The first electrically conductive polymer contacts 16 are correspondingly formed on the pads 112 on the lower surface. The first electrically conductive polymer contacts 16 are arranged in accordance with pads or UBMs (under bump metal) on a device under testing. In some embodiments, the pads 112 are vertically aligned with the pads 113. In some embodiments, a part of the pads 112 are not vertically aligned with a corresponding part of the pads 113. In addition, in some embodiments, the bottom substrate 11 comprises silicon. In some embodiments, the bottom substrate 11 comprises quartz. In some embodiments, the bottom substrate 11 comprises glass. In some embodiments, the bottom substrate 11 comprises ceramics. In some embodiments, the connections 111 comprise copper.

Since the first or second anisotropic conductive film 12 or 14 and the first and second electrically conductive polymer contacts 16 or 17 are flexible, pads or UBMs on devices under testing will not be easily damaged during testing.

Referring to FIGS. 1 and 2, the interposer 13 comprises a plurality of vertical connections 131, a plurality of pads 132 disposed on a lower surface of the interposer 13, a plurality of pads 133 disposed on an upper surface of the interposer 13, and at least one trace 134. The vertical connections 131 correspond to the pads 132. The vertical connections 131 also correspond to the pads 133. Each vertical connection 131 electrically connects a pad 132 and a corresponding pad 133 thereof. In some embodiments, at least one vertical connection 131 uses a trace 134 on an upper surface of the interposer 13 to connect to a corresponding pad 133. In some embodiments, at least one vertical connection 131 uses a trace 134 on a lower surface of the interposer 13 to connect to a corresponding pad 132. In some embodiments, the interposer 13 comprises silicon. In some embodiments, the interposer 13 comprises quartz. In some embodiments, the interposer 13 comprises glass. In some embodiments, the interposer 13 comprises ceramics. In some embodiments, the vertical connection 131 comprises copper. In some embodiments, the interposer 13 has a thickness of from 50 to 100 micrometers; however, the present invention is not limited to such range.

Referring to FIGS. 1 and 2, the first anisotropic conductive film 12 comprises a plurality of conductive particles 121. A plurality of pads 132 is disposed correspondingly to the pads 113 on the bottom substrate 11. After heating and compressing an assembly of the bottom substrate 11, the first anisotropic conductive film 12, and the interposer 13 for a predetermined time, each pad 132 and its corresponding pad 113 compresses at least one conductive particle 101 so that each pad 132 and its corresponding pad 113 are electrically connected. In some embodiments, a deformation of a conductive particle 101 compressed between each pad 132 and its corresponding pad 113 is between 20% and 80%; however, the present invention is not limited to the exemplified deformation. Such deformation ensures proper elastic contacts between the vertical probe card 1 and the devices under testing, and the achievement of good electrical connections even if the testing is performed under a high temperature.

Referring to FIGS. 1 and 2, the top substrate 15 comprises a plurality of vertical connections 151, a plurality of pads 152 corresponding to the vertical connections 151, and a plurality of pads 153 corresponding to the vertical connections 151, wherein each vertical connection 151 connects a corresponding pad 152 and a corresponding pad 153. In some embodiments, the plurality of pads 152 is vertically aligned with the plurality of pads 153. In some embodiments, a part of the pads 152 are not vertically aligned with their corresponding pads 153. In some embodiments, the top substrate 15 comprises silicon. In some embodiments, the top substrate 15 comprises quartz. In some embodiments, the top substrate 15 comprises glass. In some embodiments, the top substrate 15 comprises ceramics. In some embodiments, the vertical connection 151 comprises copper.

Referring to FIGS. 1 and 2, the pads 133 on the interposer 13 correspond to the pads 152 on a lower surface of the top substrate 15. The second anisotropic conductive film 14 comprises a plurality of conductive particles 141. Each pad 133 electrically connects to its corresponding pad 152 with at least one compressed conductive particle 141. In some embodiments, the deformation of at least one conductive particle 141 is between 20% and 80% so as to ensure proper elastic contacts between the vertical probe card 1 and the devices under testing, and the achievement of good electrical connections even if the testing is performed under a high temperature.

Referring to FIGS. 1 and 2, the plurality of pads 153 on the top substrate 15 are disposed corresponding to contacts in a test machine. The plurality of second electrically conductive polymer contacts 17 are disposed on corresponding pads 153 on the top substrate 15 so as to correspondingly touch the contacts of the test machine.

Figure 4:
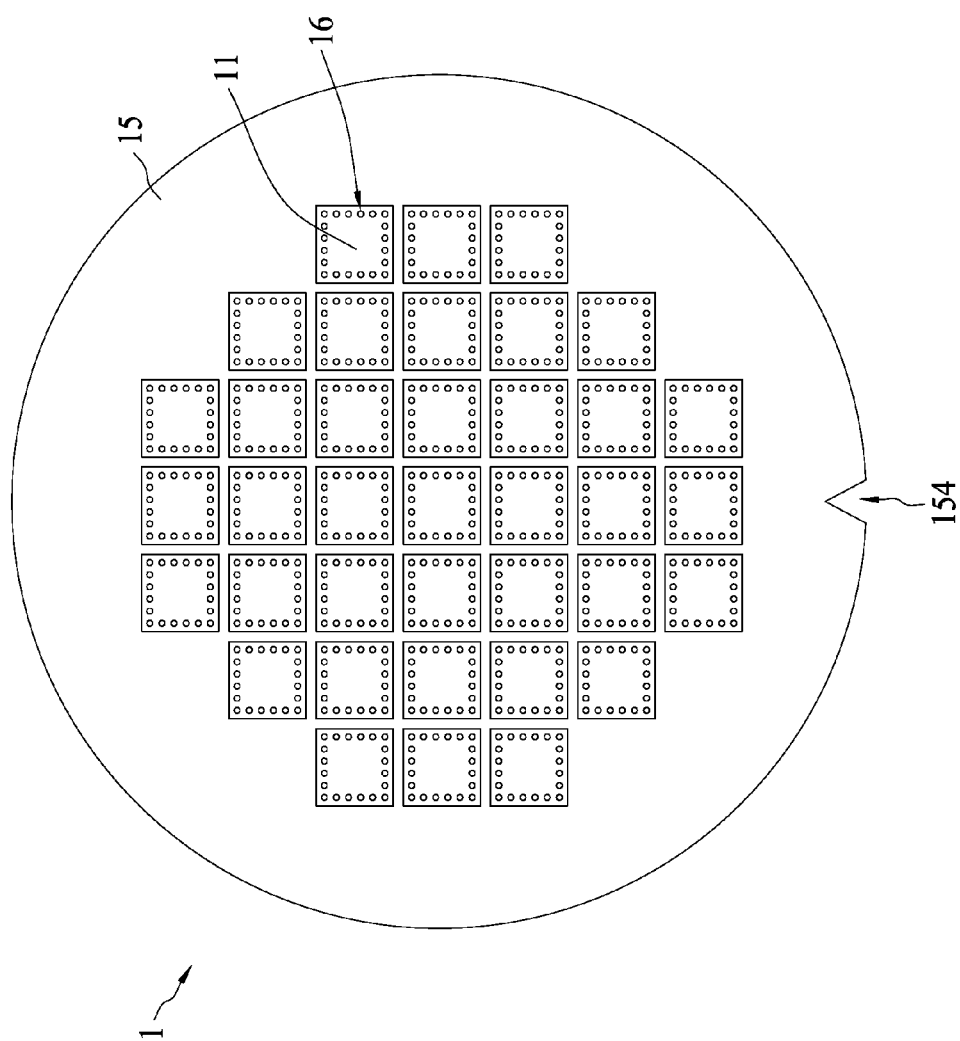
FIG. 4 is a schematic view showing a wafer-level vertical probe card according to one embodiment.

Referring to FIG. 4, in some embodiments, the top substrate 15 comprises a wafer or a display glass. In one embodiment, the wafer or the display glass includes at least one edge notch 154, which can be used for alignment when the interposer 13 is installed.

In some embodiments, one or more impedance match circuits 36 are disposed on an upper surface of the top substrate 15 or a lower surface of the bottom substrate 11 of the vertical probe card 1. The impedance match circuit 36 is used when there is an impedance mismatch between the test machine and the vertical probe card 1. The impedance match circuit 36 may be coupled with one or more second electrically conductive polymer contacts 17. In some embodiments, the impedance match circuit 36 comprises an emitter follower having a high input impedance and a low output impedance, a voltage follower, a source follower, an operational amplifier, or an instrumentation amplifier. In some embodiments, the top substrate 15 or the bottom substrate 11 is a wafer or a display glass, and the impedance match circuit 36 is disposed on an upper surface of the top substrate 15 or a lower surface of the bottom substrate 11.

Figure 3:
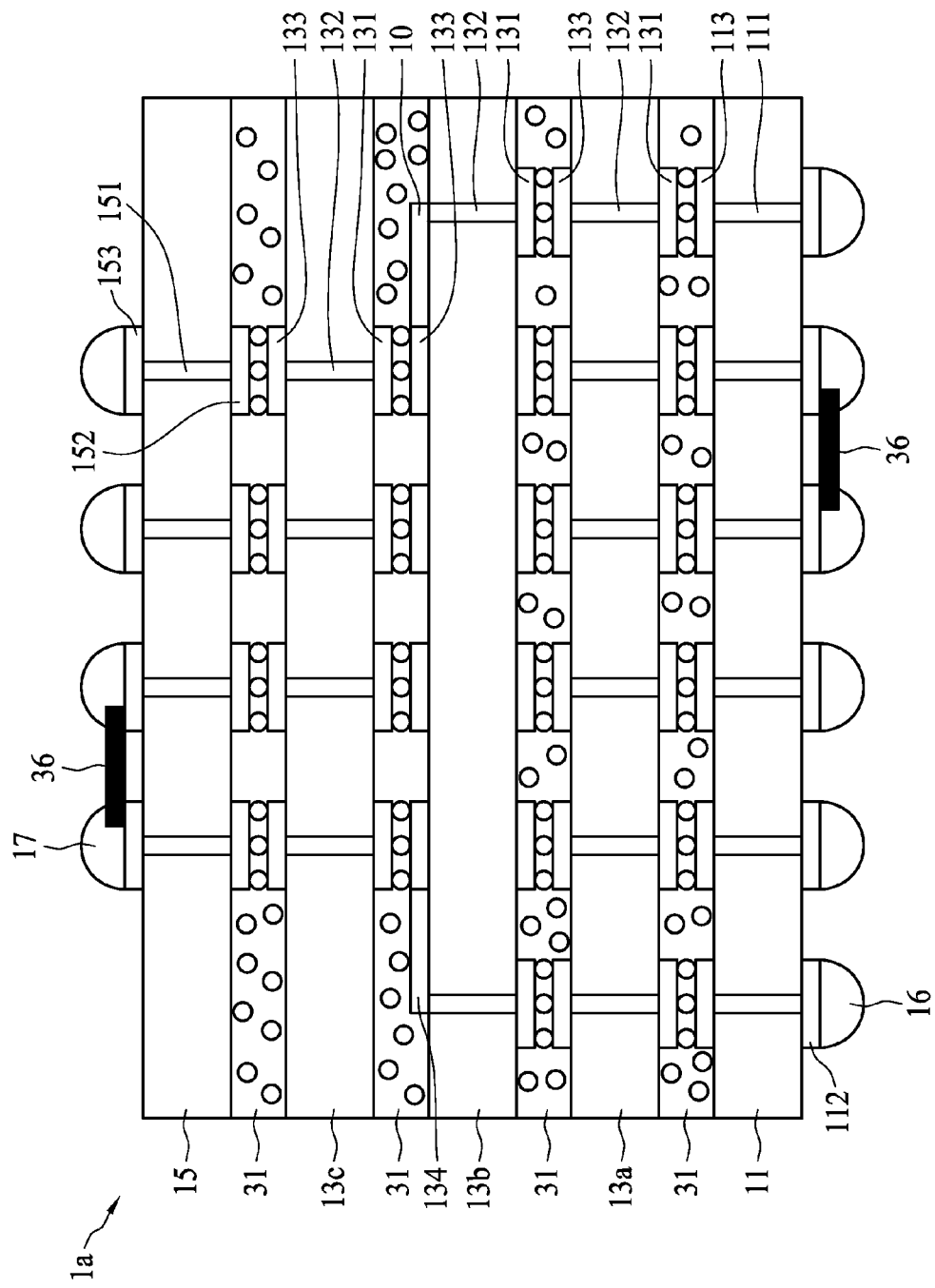
FIG. 3 is a schematic view showing a vertical probe card according to another embodiment.

Referring to FIG. 3, in other embodiments, a vertical probe card 1a comprises a bottom substrate 11, a plurality of interposers (13a to 13c), a plurality of anisotropic conductive films 31, a top substrate 15, a plurality of first electrically conductive polymer contacts 16, and a plurality of second electrically conductive polymer contacts 17. The bottom substrate 11, the plurality of interposers (13a to 13c), the plurality of anisotropic conductive films 31, and the top substrate 15 are vertically stacked. The top substrate 15 and the bottom substrate 11 are configured as outermost sides of the vertical probe card 1a. The plurality of first electrically conductive polymer contacts 16 is located on a lower surface of the bottom substrate 11. The plurality of second electrically conductive polymer contacts 17 is located on an upper surface of the top substrate 15. Each anisotropic conductive film 31 comprises a plurality of conductive particles. The bottom substrate 11 and the interposer 13a are attached and electrically connected together by an anisotropic conductive film 31. The interposer 13a and the interposer 13b are attached and electrically connected together by an anisotropic conductive film 31. The interposer 13b and the interposer 13c are attached and electrically connected together by an anisotropic conductive film 31. The interposer 13c and the top substrate 15 are attached and electrically connected together by an anisotropic conductive film 31. The plurality of first electrically conductive polymer contacts 16 and the plurality of second electrically conductive polymer contacts 17 have different layout arrangements. In the bottom substrate 11, the plurality of interposers (13a to 13c), the plurality of anisotropic conductive films 31, and the top substrate 15, there are internal conductive paths 10 and 134 to respectively connect the plurality of first electrically conductive polymer contacts 16 and the plurality of second electrically conductive polymer contacts 17. Some of the internal conductive paths 10 and 134 extend horizontally on or in the interposers (13a to 13c). In some embodiments, some internal conductive paths 10 and 134 extend horizontally on an upper surface of the top substrate 15 or a lower surface of the bottom substrate 11.

Figure 5:
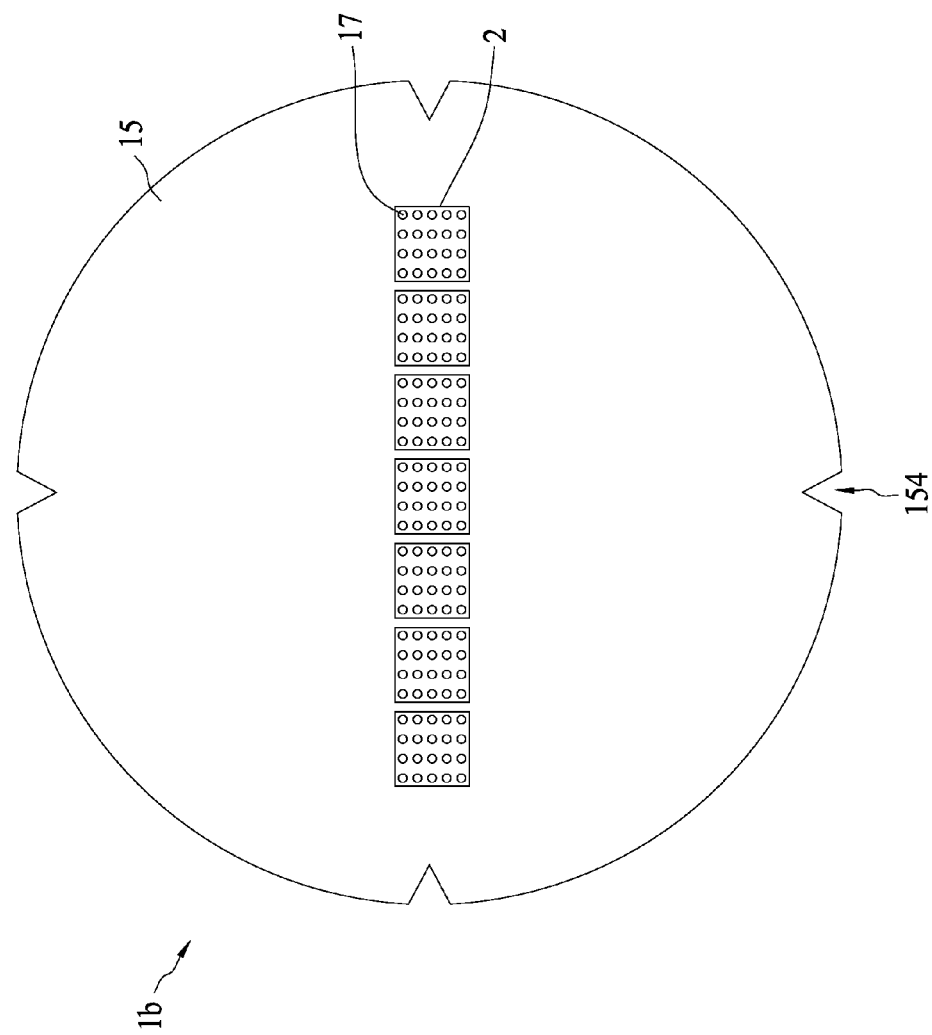
FIG. 5 is a schematic view showing a wafer-level vertical probe card according to another embodiment.
Figure 6:
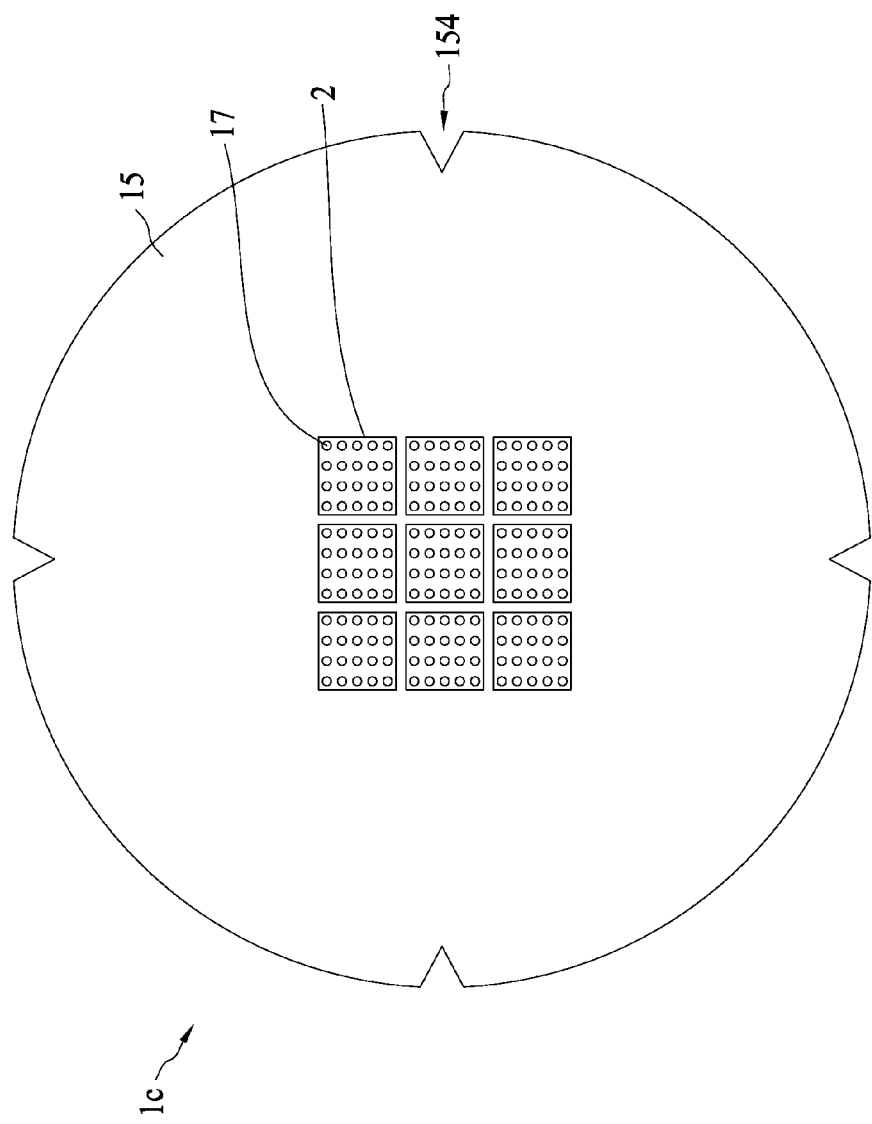
FIG. 6 is a schematic view showing a wafer-level vertical probe card according to another embodiment.

Referring to FIGS. 5 and 6, the plurality of second electrically conductive polymer contacts 17 of a vertical probe card 1b are formed into a plurality of groups 2. Correspondingly, the plurality of first electrically conductive polymer contacts 16 are formed into a plurality of groups. The first and second electrically conductive polymer contacts 16 and 17 of each group are used to test a device under testing. In some embodiments, the groups of first electrically conductive polymer contacts 16 are arranged in a line and the groups of second electrically conductive polymer contacts 17 are arranged in a line, as shown in FIG. 5. In some embodiments, the groups of first electrically conductive polymer contacts 16 are arranged in rows and the groups of second electrically conductive polymer contacts 17 are arranged in rows. In some embodiments, the groups of first electrically conductive polymer contacts 16 or the groups of second electrically conductive polymer contacts 17 use the same anisotropic conductive film. In some embodiments, each group of first electrically conductive polymer contacts 16 or each group of second electrically conductive polymer contacts 17 uses an individual anisotropic conductive film. In some embodiments, the groups of first electrically conductive polymer contacts 16 or the groups of second electrically conductive polymer contacts 17 use the same interposers. In some embodiments, each group of first electrically conductive polymer contacts 16 or each group of second electrically conductive polymer contacts 17 uses individual interposers.

Figure 7A:
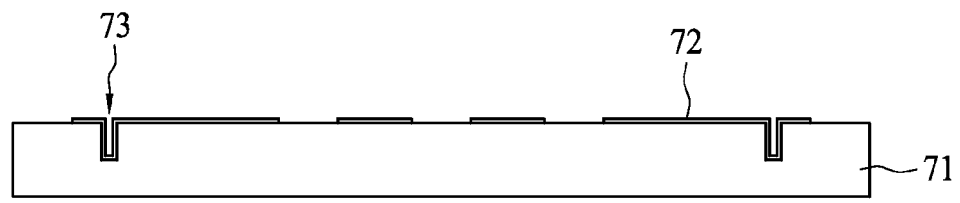
FIGS. 7A to 7D are cross-sectional views for explaining a method of manufacturing a vertical probe card.
Figure 7B:
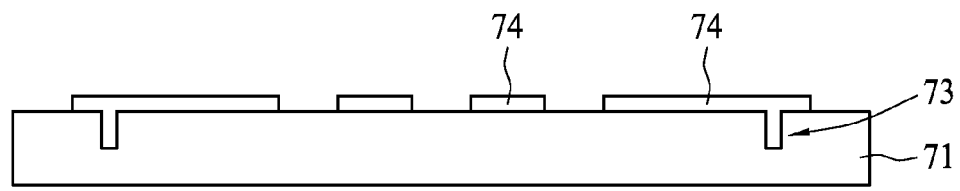

One embodiment of the present invention discloses a method for manufacturing a vertical probe card. Referring to FIG. 7A, a photoresist is coated on a substrate 71 and baked to dry. A first mask and a photolithography process are applied to form holes at locations where through holes are to be formed. A DRIE (deep reactive ion etch), ICP (inductive coupled plasma), or DRIE Bosch process is applied to etch out holes 73 with a depth of 50 to 100 micrometers. Next, the photoresist is removed. Thereafter, a second mask and a photolithography process are applied to expose areas where copper is to be deposited. Subsequently, a sputter is used to coat a layer of copper atoms as a seed layer 72 for a subsequent copper coating process. In some embodiments, the substrate 71 comprises silicon, quartz, glass, or ceramics. In some embodiments, the photoresist comprises SU-8. Referring to FIG. 7B, the substrate 71 is then electrically plated with copper. The holes 73 are filled and a copper layer 74 with a thickness of 10 to 50 micrometers is formed on a surface of the substrate 71. Next, the photoresist is removed.

Figure 7C:
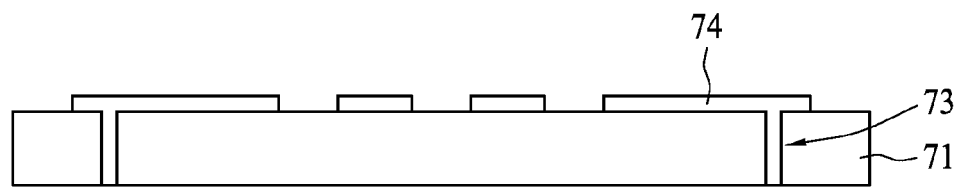

Referring to FIG. 7C, the backside of the substrate 71 is ground with a chemical mechanical polishing (CMP) process, and the process continues until copper in holes 73 is exposed.

In an alternate embodiment, a substrate 71 with a thickness less than twice of an etch depth, for example, 100 to 200 micrometers. The above-mentioned etch method is used to etch holes with a depth of 50 to 100 micrometers on the front side of the substrate 71 and etch corresponding holes with a depth of 50 to 100 micrometers on the backside of the substrate 71 to form through holes with a depth of 100 to 200 micrometer so that a CMP process is not required to grind the backside of the substrate 71 to expose copper in holes 73. Such a method will consume less substrate material and relevant materials used in the CMP process.

Figure 7D:
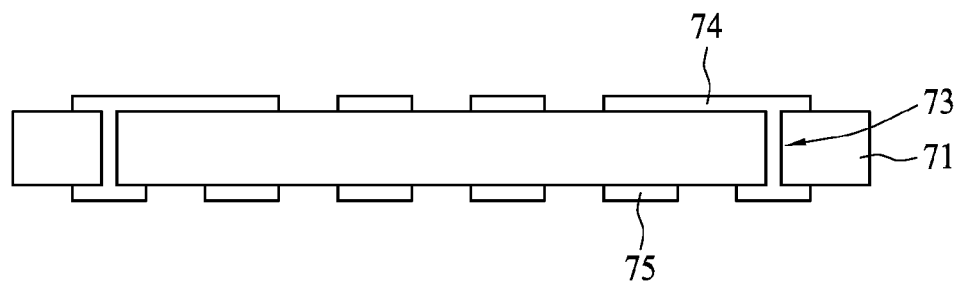

Referring to FIG. 7D, a photoresist is coated on the backside of the substrate 71. The third mask and a photolithography process are applied to expose areas where copper is to be deposited. A sputter is used to coat a layer of copper atoms as a seed layer for a later copper coating process. Finally, copper is electrically plated to form a copper layer 75 with a thickness of from 1 to 30 micrometers. Consequently, an interposer, a bottom substrate, or a top substrate is completed.

Referring to FIG. 2, an anisotropic conductive film 12 is disposed on a bottom substrate 11, and an interposer 13 is placed on the anisotropic conductive film 12. The assembly is then heated and compressed for a predetermined time in order to press conductive particles to a deformation of 20% to 80%. Next, an anisotropic conductive film 14 is disposed on the interposer 13, and the top substrate 15 is placed on the anisotropic conductive film 14. Thereafter, the newly formed assembly is heated and compressed to press conductive particles to a deformation of 20% to 80%.

The lower surface of the bottom substrate 11 and the upper surface of the top substrate 15 are coated with gold to prevent oxidation of copper layers and provide sufficient wettability for a later soldering process. Next, an (piezo-)inject printer is used to dispose conductive polymer material on pads 112 on the bottom substrate 11, or conductive polymer material is screen-printed on pads 112 on the bottom substrate 11. The conductive polymer material is then baked and hardened to create elastic contacts 16 used for touching wafers or display glass under testing. Similarly, after spraying or screen-printing conductive polymer material onto pads 153 on the top substrate 15, the deposited conductive polymer material is then baked and hardened to create elastic contacts 17 used for touching contacts of a test machine.

In at least one embodiment, a vertical probe card uses silicon, quartz, glass, or ceramic as its substrate material. Such materials are highly dielectric, have a low CTE, and exhibit good thermal conductivity, which allows the transverse thermal expansion of the vertical probe card when the wafer or display panel is under a burn-in test. In at least one embodiment, the advantages of using electrically conductive polymer contacts on upper and lower surfaces of a vertical probe card is: (1) The pads or the surfaces of UBMs of wafers or display panels can be protected from being damaged so that the process quality of forming bumps or wire-bonding in later can be ensured; (2) The engagement between the vertical probe card and the test machine can be ensured. In at least one embodiment, anisotropic conductive films are disposed between interposers, an interposer and a top substrate, or an interposer and a bottom substrate. The elastic anisotropic conductive films can absorb unevenness on probe tips, surfaces of wafers or display panels under testing, or pad surfaces of wafers or display panels under testing, or absorb occurred stresses or strains due to temperature variations. When a wafer or display panel is being tested, a force can be applied onto a back surface of the vertical probe card, wherein the force is distributed through the electrically conductive polymer contacts and the anisotropic conductive films to each probe so as to touch the surface of an aluminum pad on the wafer or display panel or cover an alloy bump on the wafer or display panel, thereby allowing an effective ohmic contact to be obtained. The vertical probe card can be used for testing a plurality of dies, or in a wafer level chip probing test or a burn-in test. The vertical connections in the vertical probe card can shorten electricity conduction paths, and therefore, it can meet the testing requirements for high frequency, high density, and narrower fine pitches.

It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:

1. A vertical probe card comprising:
    a bottom substrate;
    a top substrate;
    an interposer disposed between the bottom substrate and the top substrate;
    a plurality of first electrically conductive polymer contacts disposed on the bottom substrate and opposite to the interposer;
    a plurality of second electrically conductive polymer contacts disposed on the top substrate and opposite to the interposer, wherein the first electrically conductive polymer contacts are arranged differently from the second electrically conductive polymer contacts, and the interposer is configured to electrically connect each first electrically conductive polymer contact and a corresponding one of the second electrically conductive polymer contacts;
    a first anisotropic conductive film disposed between the bottom substrate and the interposer, configured to electrically connect the bottom substrate and the interposer; and
    a second anisotropic conductive film disposed between the interposer and the top substrate, configured to electrically connect the interposer and the top substrate.

2. The vertical probe card of claim 1, wherein the bottom substrate, the interposer, or the top substrate comprises silicon, quartz, glass, or ceramics.

3. The vertical probe card of claim 1, wherein the interposer comprises a plurality of vertical electrical connections.

4. The vertical probe card of claim 3, wherein each vertical electrical connection comprises copper.

5. The vertical probe card of claim 1, wherein the top or bottom substrate comprises a wafer or a display panel substrate.

6. The vertical probe card of claim 5, wherein the wafer or the display panel substrate comprises at least one edge notch.

7. The vertical probe card of claim 1, wherein the interposer includes a thickness of from 50 to 200 micrometers.

8. The vertical probe card of claim 1, further comprising at least one impedance match circuit disposed on an upper surface of the top substrate or a lower surface of the bottom substrate, wherein the at least one impedance match circuit is coupled with at least one of the second electrically conductive polymer contacts.

9. The vertical probe card of claim 8, wherein the impedance match circuit comprises an emitter follower having a high input impedance and a low output impedance, a voltage follower, a source follower, an operational amplifier, or an instrumentation amplifier.

10. A method for manufacturing a vertical probe card, comprising:
    disposing a first anisotropic conductive film on a bottom substrate;
    disposing an interposer on the first anisotropic conductive film;
    heating and compressing an assembly of the bottom substrate, the first anisotropic conductive film, and the interposer;
    disposing a second anisotropic conductive film on the interposer;
    disposing a top substrate on the second anisotropic conductive film;
    heating and compressing the assembly, the second anisotropic conductive film, and the top substrate; and
    spraying or coating electrically conductive material on a lower surface of the bottom substrate and an upper surface of the top substrate.

11. The method of claim 10, further comprising a step of disposing an impedance match circuit on the upper surface of the top substrate or the lower surface of the bottom substrate, and then, respectively spraying or coating the electrically conductive material on the lower surface of the bottom substrate and the upper surface of the top substrate.

* * * * *